United States Patent
Naidu et al.

(10) Patent No.: US 7,205,772 B2
(45) Date of Patent: Apr. 17, 2007

(54) ARC FAULT DETECTOR AND METHOD

(75) Inventors: Malakondaiah Naidu, Troy, MI (US); Thomas J Schoepf, Stromberg (DE); Suresh Gopalakrishnan, Farmington Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/312,929

(22) Filed: Dec. 20, 2005

(65) Prior Publication Data

US 2006/0214670 A1  Sep. 28, 2006

Related U.S. Application Data

(63) Continuation of application No. 10/831,733, filed on Apr. 23, 2004, now Pat. No. 7,009,406.

(60) Provisional application No. 60/465,461, filed on Apr. 24, 2003.

(51) Int. Cl.
*G01R 31/08* (2006.01)
(52) U.S. Cl. ..................................... 324/536
(58) Field of Classification Search ................. 324/536
See application file for complete search history.

(56) References Cited

U.S. PATENT DOCUMENTS

| 4,853,818 A | * | 8/1989 | Emery et al. ................. 361/33 |
| 5,530,364 A | * | 6/1996 | Mashikian et al. ......... 324/529 |
| 2001/0033469 A1 | * | 10/2001 | Macbeth et al. .............. 361/42 |

* cited by examiner

*Primary Examiner*—Vincent Q. Nguyen
(74) *Attorney, Agent, or Firm*—David P. Wood

(57) ABSTRACT

An arc fault detector includes a shunt resistor deployed in a protected circuit, an arc discriminator sensing voltages across the shunt resistor and producing an arc indication deduced from current variations associated with parallel and series arc faults, a signal transformer buffering the arc detection signal and producing a pulse, a switch transient detector sensing a voltage differential across load switches and producing a pulsed switch transient signal when the voltage differential across load switches exceeds a reference value, a line interrupter, such as a static relay, a switch controller including logic gates generating a trip signal based on predetermined criteria, and a manual switch for resetting the line interrupter. An embodiment comprises a voltage sensing coil enveloping a toroidal core to detect current variations in conductors passing through the core.

11 Claims, 9 Drawing Sheets

ARC FAULT DETECTOR AND METHOD

PRIORITY

This application is a continuation of, and claims benefit of priority from, co-pending U.S. non-provisional patent application Ser. No. 10/831,733, which was filed Apr. 23, 2004 now U.S. Pat. No. 7,009,406, and which is hereby incorporated by reference. This application also claims benefit of priority from U.S. provisional patent application Ser. No. 60/465,461, filed Apr. 24, 2003, which is also hereby incorporated by reference.

TECHNICAL FIELD

The present invention relates generally to the protection of electrical circuits, and, more specifically to the art of electrical arc detection and prevention.

BACKGROUND OF THE INVENTION

A need exists within the automotive industry to increase the electrical power capability for future vehicles. For example, future vehicle concepts are being studied requiring increased voltage levels in direct current (DC) systems to as high as 42 volts, approximately three times greater than conventional 14 volt systems. The driving forces contributing toward this change are the need to reduce fuel consumption and the introduction of additional electrical features. New power networks must accommodate the increased energy demand of comfort and security devices as well as the electrical needs of major systems such as braking, electric power steering and suspension systems.

The introduction of a system voltage higher than approximately 20 volts causes considerable component and system changes and has the potential to significantly impact system reliability and safety. For example, one significant impact of the increase in system voltage to levels such as the envisioned forty-two volt, direct-current network is the need to address the increased potential for arcing (shorting over a finite gap) from and within the electrical distribution systems and components. One particularly vulnerable component of electrical systems are the wiring harnesses, wherein arc faults may be encountered as a result of cut, pinched or chaffed wiring. Accordingly, a substantial need exists to protect electrical distribution systems, and particularly wire harnesses, from unwanted arc faults.

In the instance of a wire being cut or broken under an electrical load, an arc may be drawn between both ends. Such an arc is unwanted and unplanned for, and its extinction is uncertain. Therefore, severe damage may occur if the arc is sustained. This type of arc fault is called a series arc fault, as the arc is in series to the load. Hot unplugs due to vibrating loose connections fall into the same series arc fault category. Series arc faults cannot typically be cleared by fuses or circuit breakers.

Arc faults in parallel to the load are identified as parallel arc faults. An example of parallel arc faults can be damaged wires drawing an arc to a ground potential, such as a chassis of an automobile. The insulation jacket of such wires might be broken due to aging or shaved, chaffed or pinched cable jackets. This type of arc fault is usually created by a temporary short circuit. The arc fault current, however, may thermally over load and damage contacts within the circuit due to low contact force resulting in melting and evaporating contact material followed by more arcing. The arc fault current, limited by the circuit impedance and the arc voltage, can be significantly lower than the trip current of the protection device such as a fuse or circuit breaker, so that the fault is cleared late depending on the time or current characteristics or in some cases not at all.

Many patents disclose arc fault detection systems and methods for alternating current (AC) applications. However, fewer arc detection devices and methods are disclosed for direct current (DC) applications.

Consequently, there remains a need in the art for arc detection and protection systems and methods for DC circuits capable of rapidly detecting both parallel and series arcs. It would be beneficial to have a system and method capable of distinguishing unwanted and unplanned arcs from expected transient arcs such as those caused by the opening of a load switch. It would be further beneficial to utilize arc detection components such as sensors that are small so that they can be incorporated in devices such as electrical connectors, junction blocks, relays, circuit breakers, and the like. It would also be desirable to have a systems and methods continuously monitoring for arcing conditions rather than periodically sampling. It would further be desirable to have an arc detection and protection system that uses low cost components without requiring the use of microprocessors or complex algorithms.

SUMMARY OF THE INVENTION

The methods and apparatus of the present invention address many of the shortcomings of the prior art. The present invention provides a system and method of detecting an arc fault by detecting a current change indicative of an arc fault. An exemplary embodiment of the invention is capable of distinguishing an arc fault from slow current transients caused by load variations and low frequency commutation ripple current of DC motors under normal operating conditions. An exemplary embodiment of the invention includes a switch transient detector which detects voltage differential across load switches and generates a switch transient signal which is used to prevent a trip signal from being generated. This eliminates a source for nuisance tripping of a circuit interrupter and helps to avoid the need for costly microprocessors and complex algorithms to distinguish switch transients.

In an exemplary embodiment, a current shunt resistor is coupled at the input side of a protected load as part of a system to detect a current change indicative of an arc fault. In an exemplary embodiment, the current shunt resistor is small enough to be deployed in devices such as smart electrical connectors and smart junction blocks.

In another exemplary embodiment, a pickup coil wound on a toroidal or UI type magnetic core is coupled at the input side of a protected load to detect a current change indicative of an arc fault. Consequently, the invention is capable of being deployed at only an input side or only a load side without a need for sensors, wires, and other components to be deployed on both a load and input side.

A first preferred embodiment of an arc fault detector according to the present invention includes a current shunt resistor coupled in series with a circuit and an arc discriminator including an amplifier sensing a first voltage on a first side of the current shunt resistor, sensing a second voltage on a second side of the current shunt resistor, and producing a first signal proportional to a current flow through the current shunt resistor. The arc discriminator further includes a change detector receiving the first signal as input and producing an arc fault detection signal as output when the change detector detects a change in the first signal indicative of a presence of an arc fault in the circuit.

In a preferred embodiment the change detector includes a series arc detector and a parallel arc detector.

Another preferred embodiment of an arc fault detector according to the present invention includes a current monitor detecting a rate of change in electrical current in said circuit and producing a first signal indicative of said rate of change. The arc fault detector further includes a signal isolator electrically coupled in series with the circuit monitor filtering the first signal to substantially eliminate signals outside a selected frequency range, the signal isolator producing a filtered signal (i.e., isolating a desired signal) representing changes in the electrical current within the selected frequency range. The arc fault detector further includes an arc indicator producing an arc detection signal when a voltage level of the filtered signal exceeds at least one threshold.

In an exemplary embodiment, the current monitor is toroidal coil wrapped around a magnetic or UI core and the arc indicator is a Schmitt Trigger.

A preferred method for detecting an arc fault in a circuit in accordance with present invention includes coupling a current shunt resistor in the circuit, monitoring a voltage differential across the current shunt resistor, detecting a change in the voltage differential, comparing the change to at least one threshold, and generating a signal when the change exceeds the at least one threshold.

A second preferred method for detecting an arc fault in a circuit in accordance with present invention includes providing a coil wrapped around a toroidal core, passing at least one conductor of the system through the center of the toroidal core, detecting a voltage induced in the coil by a change in current flowing through the at least one conductor, filtering the voltage so as to eliminate signals outside a selected frequency range and to produce a filtered or isolated signal, comparing the filtered (i.e., isolated) signal to at least one threshold; and generating an arc detection signal when said filtered signal exceeds said at least one threshold.

These and other features and advantages of the present invention will become apparent from the following brief description of the drawings, detailed description, and appended drawings.

BRIEF DESCRIPTION OF THE DRAWINGS

The above-mentioned features of the present invention can be more clearly understood from the following detailed description considered in conjunction with the following drawings, in which like numerals represent like elements and in which.

DETAILED DESCRIPTION OF THE INVENTION

As discussed above, the methods and systems of the present invention provide improved arc fault detection capable of detecting series and parallel arcs in a DC circuit using low cost electronics without a need for microprocessors or sophisticated algorithms.

Figure 1:
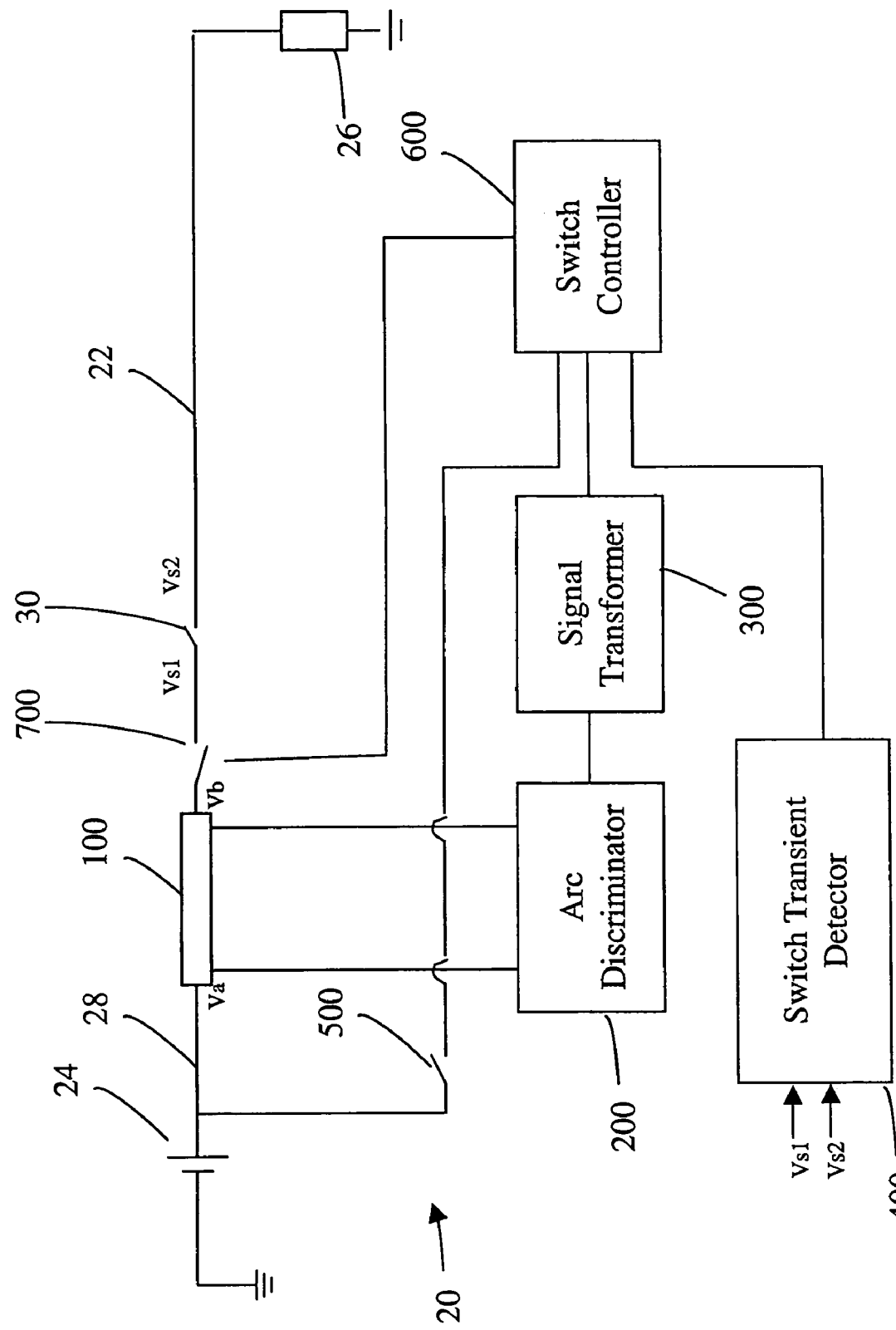
FIG. 1 is a simplified block diagram of a system incorporating a first exemplary embodiment of an arc fault detector in accordance with the present invention.

Referring first to FIGS. 1–4, FIG. 1 is a simplified diagram illustrating a first exemplary embodiment of an arc fault detector 20 of the present invention. As shown in FIG. 1, arc fault detector 20 provides protection to a circuit 22. Circuit 22 includes a direct current power source or battery 24 providing power to a load 26 via a conductor 28. A load switch 30 is disposed in conductor 28.

Arc fault detector 20 includes a current shunt resistor 100, an arc discriminator 200, an arc fault signal generator or signal transformer 300, a switch transient detector 400, a manual switch 500, a switch controller 600, and a line interrupter 700.

Current shunt resistor 100 is coupled to circuit 22 in series with conductor 28. Arc discriminator 200 detects a voltage differential across current shunt resistor 100, produces a signal proportional to a current flow through the current shunt resistor 100, and detects a change in the signal to produce an arc fault detection signal when a series arc fault or parallel arc fault is detected.

Signal transformer 300 generates a pulse in response to detection of an arc fault. The pulse width extends for the period of time that an arc fault is detected.

Switch transient detector 400 detects a voltage differential across load switch 30 and outputs a pulsed switch transient detection signal when the voltage differential across load switch 30 exceeds a reference value. The reference value is set at a level indicating an opening of load switch 30. As later described, switch transient detector 400 may include inputs to detect voltage differential across multiple load switches and one or more logic gates to output a switch transient detection signal if a voltage differential across any one of the switches exceeds a reference value.

Manual switch 500 is used to manually close and open line interrupter 700.

Switch controller 600 senses the pulse output from signal transformer 300, switch transient detection signal from switch transient detector 400, and voltage provided by battery 24 via manual switch 500. In a preferred embodiment, switch controller 600 uses logic gates to output a trip signal controlling line interrupter 700.

Figure 2:
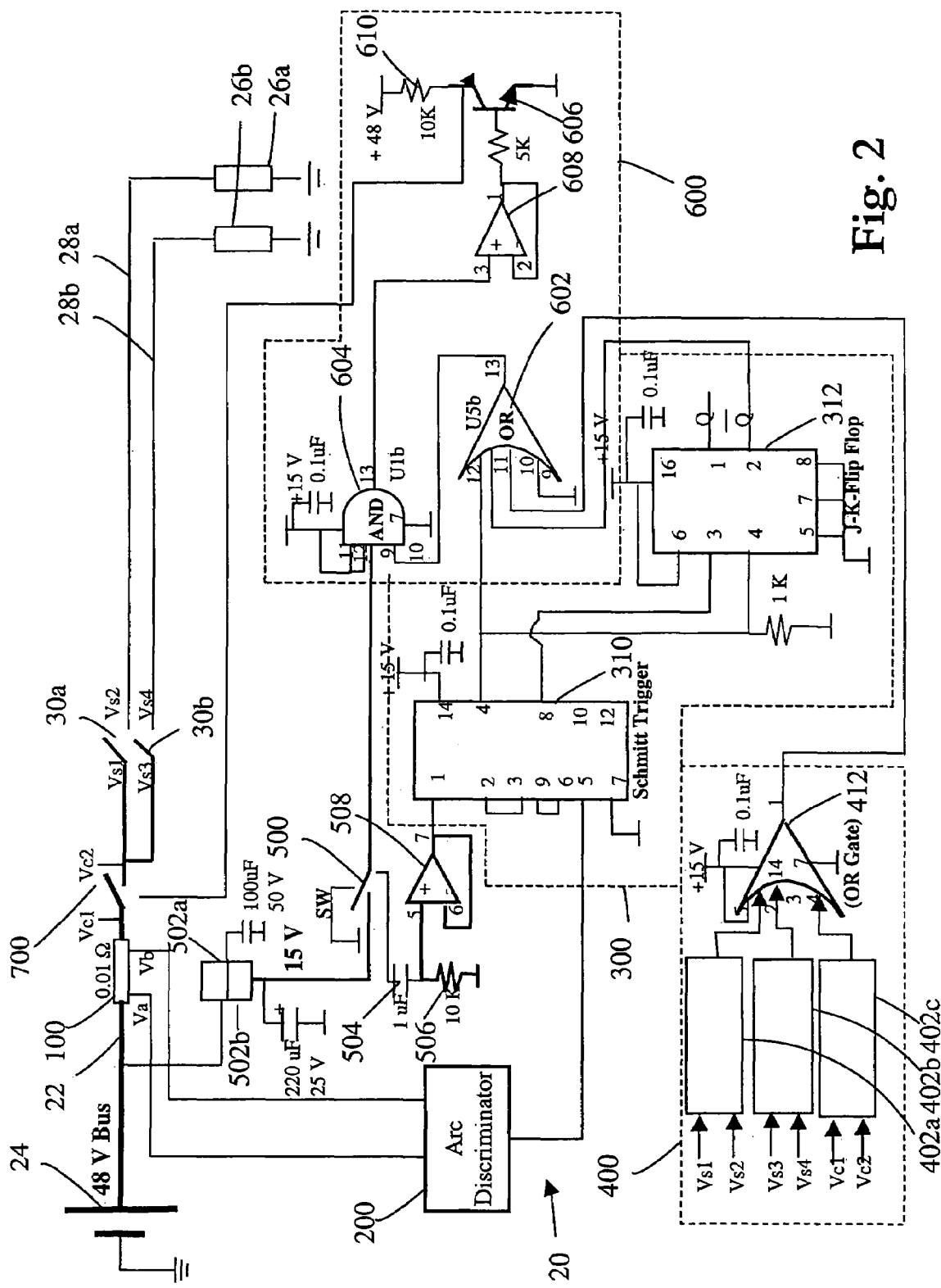
FIG. 2 is a circuit diagram of a system incorporating the first exemplary embodiment of an arc fault detector in accordance with the present invention.

Referring now to FIG. 2, arc fault detector 20 provides protection to a circuit 22. Circuit 22 includes direct current power source or battery 24 providing power to loads 26a, 26b via conductors 28, 28a, 28b. A load switch 30a, 30b is disposed in each of conductors 28a, 28b, respectively.

Shunt resistor 100 is coupled in series with circuit 22 and also in series with conductor 28. Arc discriminator 200 senses a voltage $v_a$, $v_b$ at each side of current shunt resistor 100.

Figure 3:
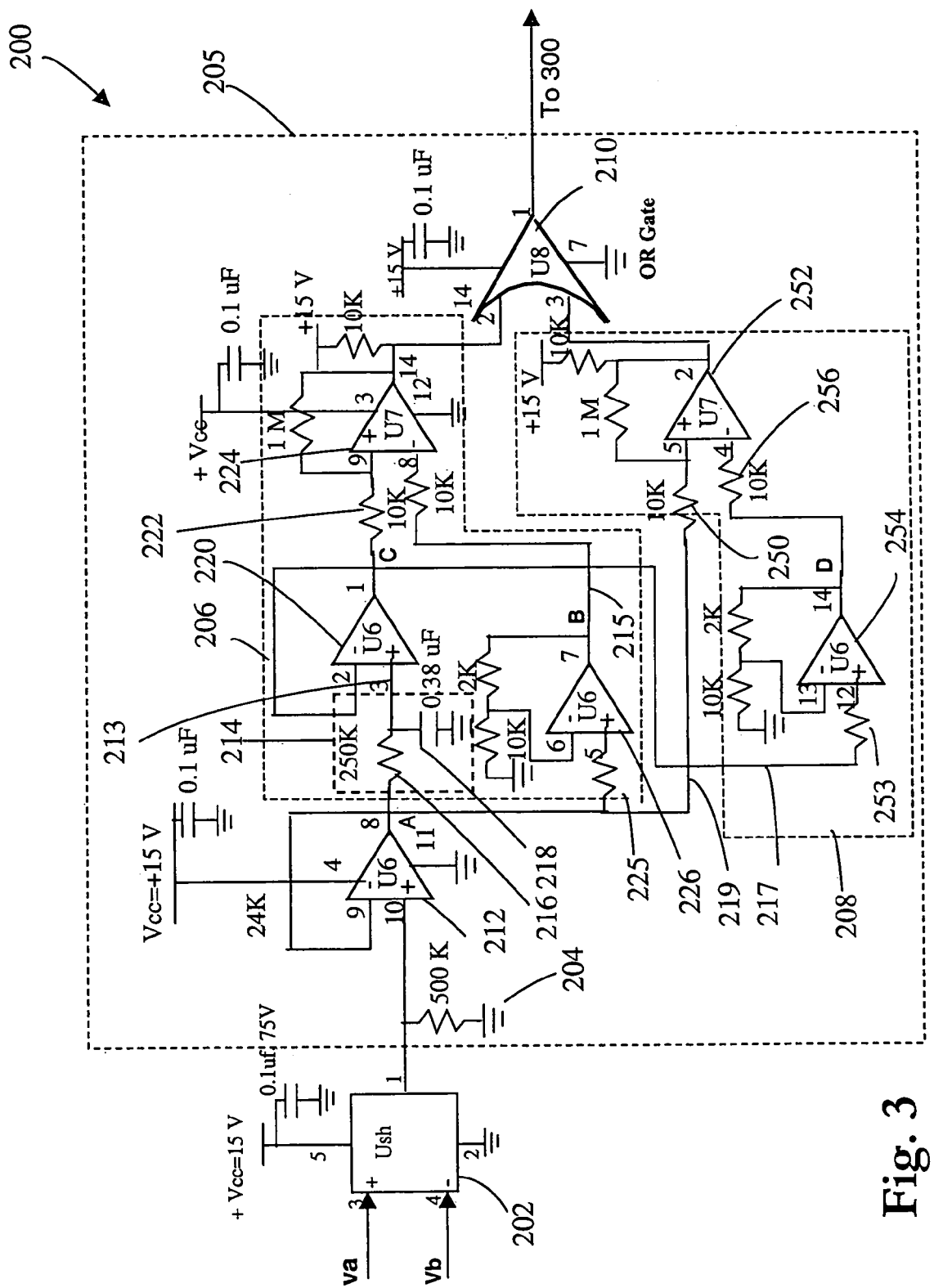
FIG. 3 is a circuit diagram illustrating an aspect of a fault detector in accordance with the present invention.

As shown in FIG. 3, arc discriminator 200 includes a current shunt amplifier 202 and change detector 205. Current shunt amplifier 202 senses voltages $v_a$, $v_b$ from each side of current shunt resistor 100 at input terminals 3 (+ve) and 4 (−ve), respectively. It is assumed that $v_a$ is more positive than $v_b$ as current flows from $v_a$ to $v_b$ in current shunt resistor 100. Current shunt amplifier 202 outputs a voltage signal to a change detector 205. The voltage signal is proportional to the current flowing through current shunt resistor 100. Change detector 205 includes output resistor 204 electrically coupled to a pin 1 of current shunt amplifier 202. Change detector 205 further includes a series arc fault detector 206 and a parallel arc fault detector 208 each feeding an output signal to an OR Gate 210 as further described below.

Current shunt amplifier 202 is coupled to an input of a first buffer 212. First buffer 212 has a first output electrically coupled to a first delay circuit 213 and a second output electrically coupled to a first reference circuit 215. First delay circuit 213 provides a delayed signal as an output to a first input of a first comparator 224. First reference circuit 215 provides a reference signal as an output to a second input of first comparator 224. Series arc fault detector 206 includes first delay circuit 213, first reference circuit 215, and first comparator 224.

First delay circuit 213 includes a low pass signal isolator (R-C circuit) 214 including a resistor 216 and a capacitor 218. First delay circuit 213 further includes a second splitter or buffer 220 and a resistor 222. First reference circuit 215 includes a resistor 225 electrically coupled to an input of an amplifier 226. First comparator 224 is configured to output a series arc detection signal only when a voltage at the output of first delay circuit 213 is greater than a voltage at the output of first reference circuit 215. This condition occurs when there is a decrease in the voltage signal provided by the output of current shunt amplifier 202 which causes the voltage in first reference circuit 215 to decrease. The time delay provided by low pass signal isolator 214 delays a decrease in voltage in first delay circuit 213 enabling the voltage in first delay circuit 213 to exceed the voltage in first reference circuit 215. Note that first reference circuit 215 includes amplifier 226 which provides a gain. First comparator 224 outputs to a first input of OR Gate 210. OR Gate 210 is configured to output an arc fault detection signal when the said series arc fault detection signal is detected at the first input.

Parallel arc fault detector 208 includes a second delay circuit 217 which originates from a second output of second buffer 220, a second reference circuit 219 which originates from the second output of first buffer 212, and a second comparator 252.

Second delay circuit 217 includes a resistor 253 electrically coupled to an input of an amplifier 254. Second reference circuit 219 includes a resistor 250.

Second delay circuit 217 provides a delayed signal as an output to a second input of second comparator 252. Second reference circuit 219 provides a reference signal as an output to a first input of second comparator 252.

Second comparator 252 is configured to output a parallel arc detection signal only when a voltage at the output of delay circuit 217 is less than a voltage at the output of reference circuit 219. This condition occurs when there is an increase in the voltage signal provided by the output of current shunt amplifier 202 which causes the voltage in reference circuit 219 to increase. The time delay provided by low pass signal isolator 214 delays an increase in voltage in delay circuit 217 enabling the voltage in reference circuit 219 to exceed the voltage in delay circuit 217. Note that delay circuit 217 includes amplifier 254 which provides a gain.

Second comparator 252 outputs to a second input of OR Gate 210. OR Gate 210 is configured to output an arc fault detection signal when the said parallel arc fault detection signal is detected at the second input.

In a series arc condition the current flowing through current shunt resistor 100 goes down compared to a normal condition. The output signal from current shunt differential amplifier 202 is buffered with splitter or buffer 212 and the buffered voltage at a first output 8 is fed to a low pass signal isolator 214 including a resistor 216 and a capacitor 218 to introduce a time delay into the signal and to signal isolator low frequency ripple due to motor loads. The output of low pass signal isolator 214 is buffered by buffer 220 and fed to an input resistor 222 electrically coupled to the +ve input 9 of a comparator 224. The amplified signal of buffer 212 is fed to input resistor 225 of buffer 226 electrically coupled to the −ve 8 input of comparator 224. Comparator 224 compares voltage input at pin 8 with time delayed voltage input at pin 9 to detect a change in voltage that exceeds a gain provided by amplifier 226. The amplifier gain is selected such that comparator 224 does not produce output voltage under normal conditions. In an exemplary embodiment, a gain of 1.1 to 1.2 is selected.

When a series arc occurs, the current suddenly drops initially and current shunt amplifier 202 produces a voltage proportional to the arc current at location "A" and also at location "B". The magnitudes of the voltages at these points are less than the voltages under normal load before an arc fault. Low pass signal isolator 214 filters the voltage transient caused by the arc current momentary and the buffered output voltage at location "C" is the same as before the arc fault which is greater than the voltage at location "B". This condition allows comparator 224 to produce output voltage which is fed to input 2 of OR Gate 210.

In the case of a parallel arc fault condition, the current flowing through current shunt resistor 100 goes up compared to a normal load condition. The buffered output of current shunt amplifier 202 at location "A" is electrically coupled to input resistor 250 electrically coupled to the +ve input 5 of a comparator 252. The buffered and time delayed signal isolator output at location "C" is fed to amplifier 254 to produce output at location "D" which is slightly less than at location "A". This signal is fed to input resistor 256 electrically coupled to the −ve input 4 of comparator 252. Under normal load conditions or under series arc fault condition comparator 252 does not produce an output voltage. When a parallel arc occurs, the +ve input 5 of second comparator 252 is greater than the −ve input. 4. This is because low pass signal isolator 214 filters the voltage due to the initial current transient of the arc. This introduces a time delay. Second comparator 252 outputs a parallel arc detection signal to a second input of OR Gate 210 when a voltage at the output of delay circuit 217 is less than a voltage at the output of reference circuit 219.

When either a series or parallel arc occurs, OR Gate 210 produces an output signal at pin 1 indicating an arc fault which is sensed by signal transformer 300. Referring back to FIG. 2, signal transformer 300 includes Schmitt Trigger 310 and J-K Flip-Flop 312. The output signal from OR Gate 210 is received by input 5 of Schmitt Trigger 310. Schmitt Trigger 310 output at pin 8 is fed to a clock input pin 3 of J-K Flip Flop 312. Under fault J-K Flip Flop 312 is set with the rising edge of the input clock at pin 3, a complementary output of the Q at pin 2 of J-K Flip Flop 312 goes from High to Low during fault. Under normal conditions pin 2 is High. The output signal from pin 2 is fed to an input 11 of an OR Gate 602 included in Switch Controller 600.

Figure 4:
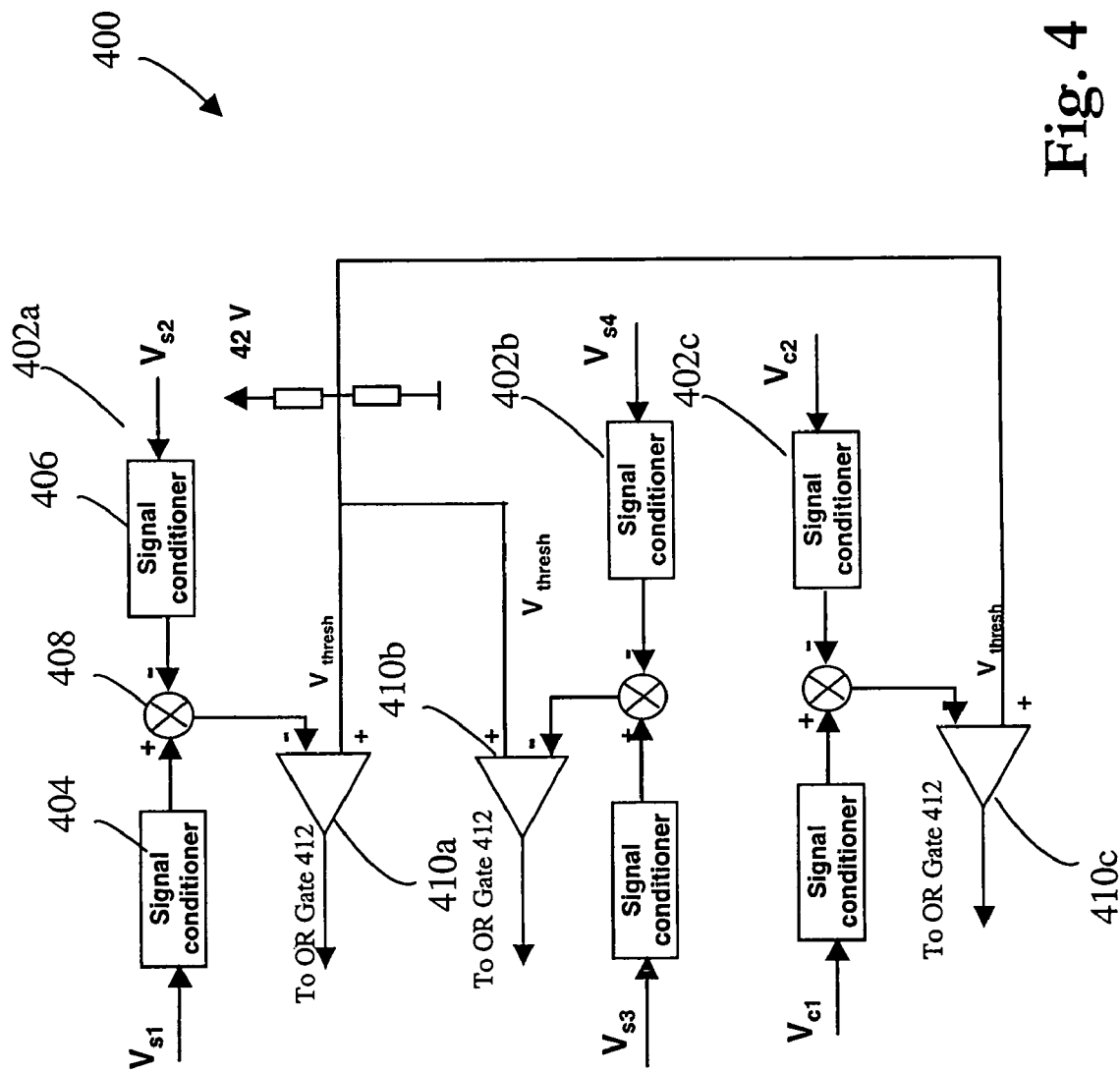
FIG. 4 is a circuit diagram illustrating another aspect of a fault detector in accordance with the present invention.

Referring to FIGS. 2 and 4, switch transient detector 400 includes a switch transition detection circuit 402a, 402b, 402c for each switch being monitored. As shown on FIG. 4, switch transition detection circuit 402a senses a voltage $v_{s1}$, $v_{s2}$ on each side of load switch 30a. The voltages $v_{s1}$, $v_{s2}$ are each fed through a respective signal conditioner 404, 406 fed to a summing amplifier 408. A voltage differential is output by summing amplifier 408 and fed to a comparator 410 where the differential voltage is compared to a reference voltage with a reference value preferably set between 6 and 10 volts. Switch transition circuits 402b, 402c are structured and function similar to switch transition circuit 402a. The output of the respective comparators 410a, 410b, 410c associated with each monitored switch 30a, 30b, 700 is fed to an OR Gate 412. Under normal conditions, the voltages differential across each of the switch terminals 30a, 30b, 700 and the output of the switch transient detector 400 are Low. A switch 30a, 30b, 700 opening under load creates an arc across the switch, which causes voltage drop across the switch. Under this condition, the output of switch transient detector 400 goes High. The outputs from each of the switch transition detection circuit 402a, 402b, 402c are fed to the input pins 2, 3, and 4 of OR Gate 412. The output of OR Gate 412 is fed to an input 10 of Or Gate 602.

Manual switch 500 enables line interrupter 700 to be manually reset. Manual switch 500 functions to provide a mechanism to manually close and open line interrupter 700. Line interrupter 700 functions to disconnect an arc fault from power source 24. Manual switch 500 is a single pole double throw switch with a first pole grounded. A second pole is electrically coupled to a 15V supply derived from power supplied-from 48V battery 24 by using linear regulators 502a, 502b. Two regulators 502a, 502b are cascaded to reduce power dissipation in the individual devices. The second pole is electrically coupled to a pin 9 of an AND Gate 604 included in Switch Controller 600. The second pole is also ground through capacitor 504 and resistor 506. Under normal operation, manual switch 500 is closed and the input 9 to AND Gate 604 is High while the input pin 10 of AND Gate 604 is also High. Therefore, the output of AND Gate 604 is also High under normal operation thereby driving an n-p-n transistor 606 via a buffer 608. The collector of transistor 606 is electrically coupled to 48V power supply (battery 24) via a 15K resistor 610. The collector output is electrically coupled to line interrupter 700. Preferably, line interrupter 700 is a static relay configured to close with zero input signal and open with 48V input signal. Under normal operation, line interrupter 700 is closed.

Under an arc fault condition, output pin 8 of Schmitt Trigger 310 feeds a signal to input pin 3 of Flip Flop 312 thereby setting Flip Flop 312. Consequently, output pin 2 of Flip Flop 312 goes low which is fed to input pin 11 of OR Gate 602. Since all of the inputs (9, 10, 11, 12) of OR Gate 602 are Low, the output at pin 13 is Low. This Low output is fed to input pin 10 of AND Gate 604. The signal from manual switch 500 is fed to input pin 9 of AND Gate 604. The output 13 of AND Gate 604 is buffered by buffer 608 and fed to base of transistor 606 to turn OFF. This causes the line interrupter 700 to trip.

Once line interrupter 700 trips, J-K Flip Flop 312 is in a set condition where pin 2 is Low. By opening and closing, manual switch 500 disconnects the 15V power supply and connects to input pin 1 of Schmitt Trigger 310 via capacitor 504 and an amplifier 508. This produces a voltage spike across resistor 506 since R-C (resistor 506-capacitor 504) combination acts as a differentiator. This pulse is fed to input pin 1 of Schmitt Trigger 310. Output pin 2 is electrically coupled to input pin 3 producing a pulse of finite pulse width at output pin 4 of Schmitt Trigger 310. This pulse width depends on the R-C time constant of resistor 506 and capacitor 504. The output of pin 4 of Schmitt Trigger 310 is electrically coupled to reset pin 4 of J-K Flip Flop 312 and also to the input pin 9 of OR Gate 602. The J-K Flip Flop 312 resets and thus makes the output pin 2 High, which is electrically coupled to the input pin 11 of OR Gate 602. The output 13 of OR Gate 602 is High and fed to input pin 10 of AND Gate 604. Since two inputs (9 and 10) of AND Gate 604 are High it output at pin 13 is High driving the collector of transistor 606 to Low. This Low signal to the input of line interrupter 700 closes line interrupter 700. Line interrupter 700 can be manually opened by connecting manual switch 500 to ground, causing the output 13 of AND Gate 604 to go Low, thus tripping line interrupter 700. Line interrupter 700 can be closed manually by connecting manual switch 500 to 15V power supply.

Figure 5:
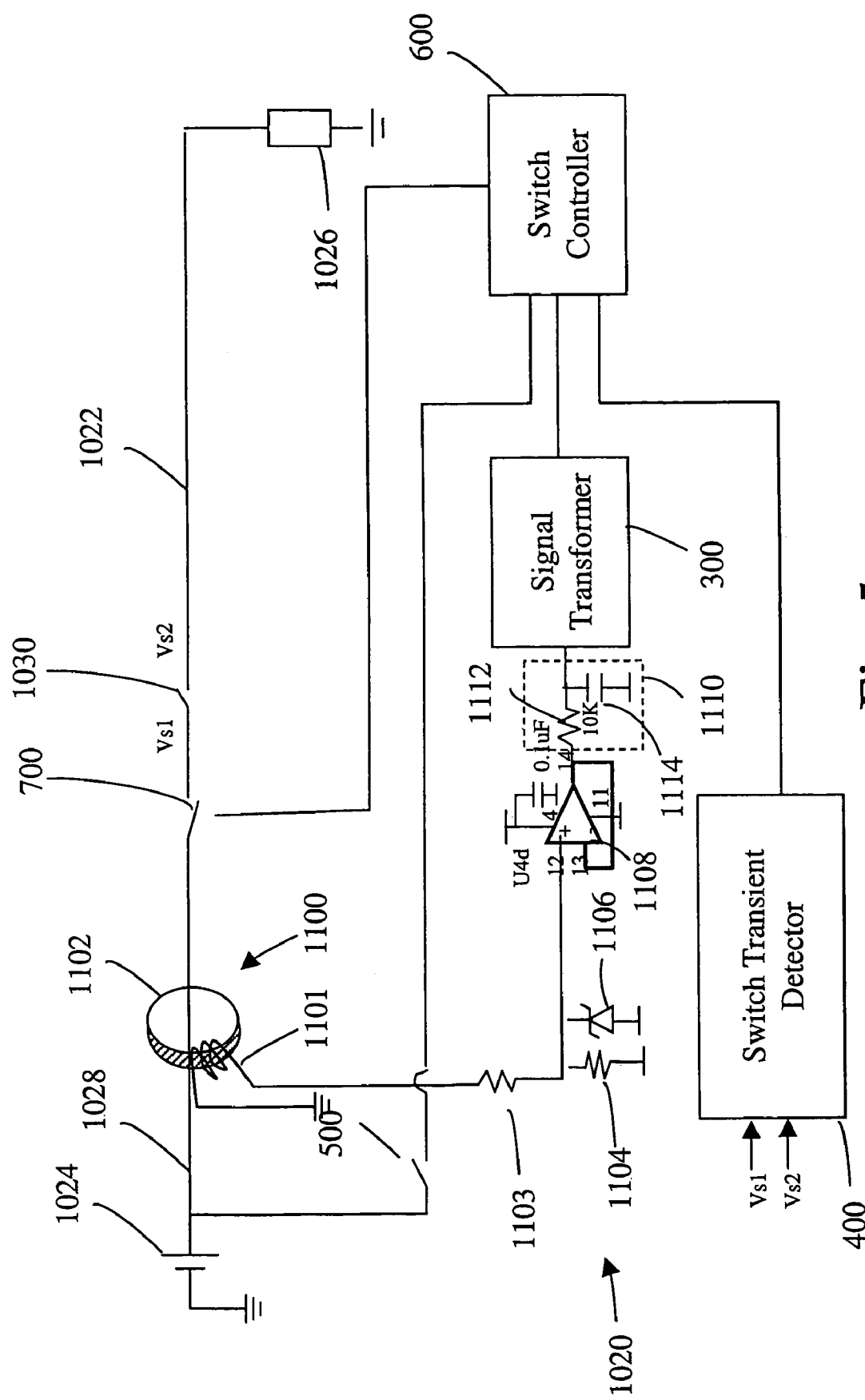
FIG. 5 is a simplified block diagram of a system incorporating a second exemplary embodiment of an arc fault detector in accordance with the present invention.
Figure 6:
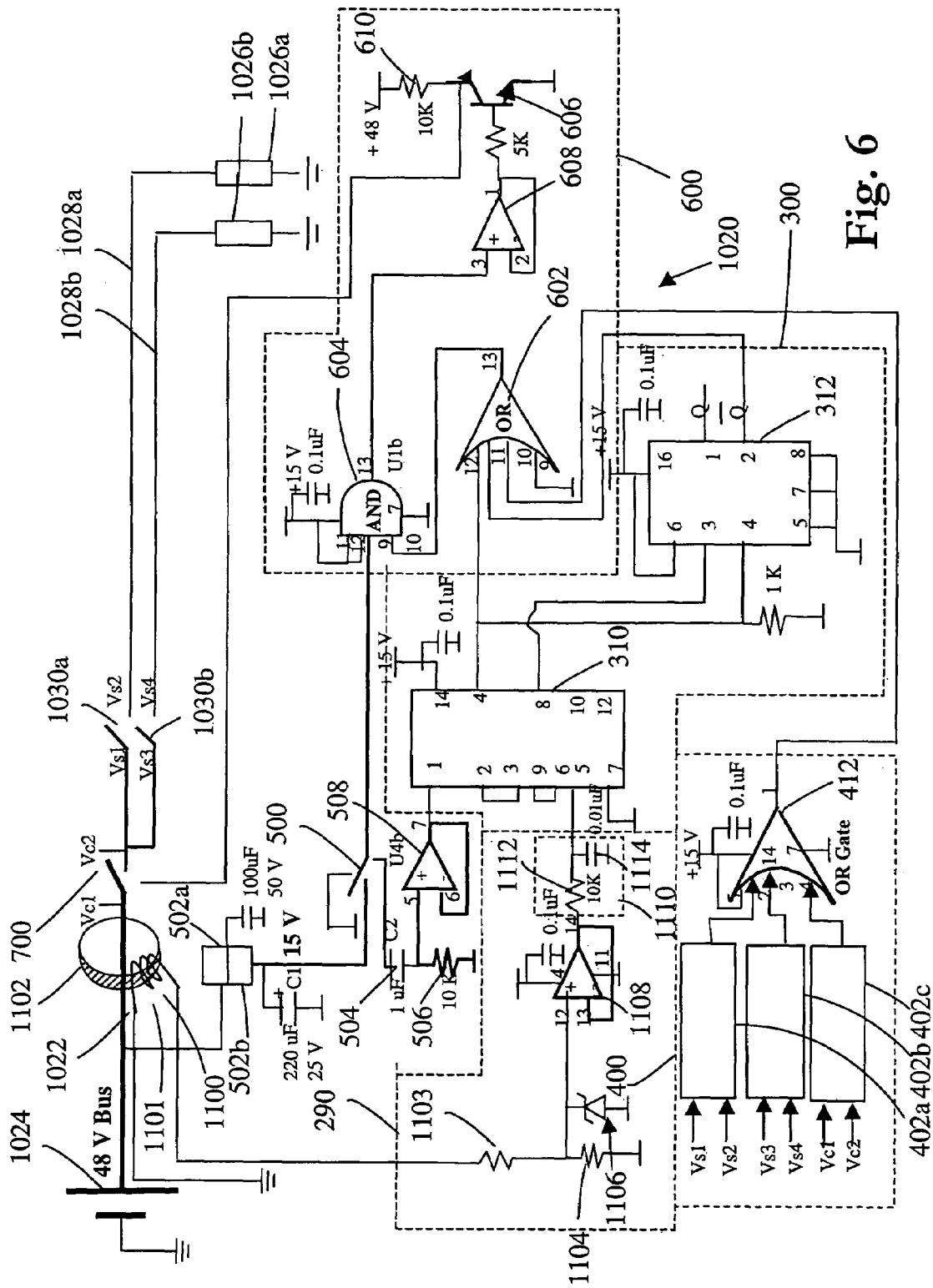
FIG. 6 is a circuit diagram of a system incorporating the second exemplary embodiment of an arc fault detector in accordance with the present invention.

Referring now to FIGS. 5–6, FIGS. 5 and 6 illustrate a second exemplary embodiment of an arc fault detector according to the present invention.

FIG. 5 is a simplified diagram illustrating a second exemplary embodiment of an arc fault detector 1020 of the present invention. As shown on FIG. 5, arc fault detector 1020 provides protection to a circuit 1022. Circuit 1022 includes a direct current power source or battery 1024 providing power to a load 1026 via a conductor 1028. A load switch 1030 is disposed in conductor 1028.

Arc fault detector 1020 includes a current monitor 1100 detecting a rate of change in electrical current in circuit 1022 and producing a first signal indicative of said rate of change. Arc fault detector 1020 further includes a signal isolator 1110 electrically coupled in series with the current monitor 1100. The signal isolator functioning to signal isolator the first signal to substantially eliminate signals outside a selected frequency range, the signal isolator 1110 producing a filtered signal representing changes in the electrical current within the selected frequency range. Arc fault detector 1020 also includes an arc indicator (preferably Schmitt Trigger 310) producing an arc detection signal when a voltage level of the filtered signal exceeds at least one threshold. The threshold is preferably established by Schmitt Trigger 310. Another device, such as amplifier 1108, or a comparator may also be used to provide a threshold. Another device such as a monostable vibrator may also be used Arc fault detector 1020 includes current monitor 1100 and an arc determining circuit 290. Current monitor 1100 includes a coil 1101 wrapped around a toroidal core or UI core 1102. Arc determining circuit 290 includes an attenuator or first resistor 1103, a second resistor 1104, a zener diode 1106, an operational amplifier 1108, and a low pass signal isolator 1110. Low pass signal isolator 1110 includes a resistor 1112 and a capacitor 1114. Arc fault detector 1020 further includes a signal transformer 300, a switch transient detector 400, a manual switch 500, a switch controller 600, and a line interrupter 700.

Circuit 1022 passes through the center of toroidal core 1102 inducing a voltage pulse in coil 1101 due to a current change caused by a series or parallel arc fault. Attenuator or resistor 1103 is selected so that the voltage level of the filtered signal output to Schmitt Trigger 310 when generated by operation of a motor commutator is lower than the threshold voltage needed to be provided to Schmitt Trigger 310 to enable an output pulse to be generated.

Resistor 1104 provides a path to ground for the voltage pulse. The voltage is provided to operational amplifier 1108 via zener diode 1106 which clamps the voltage to 12V to protect downstream components in the event the induced voltage is too high.

Signal transformer 300, switch transient detector 400, manual switch 500, switch controller 600, and line interrupter 700 of arc fault detector 1020 are configured and operate as described in the exemplary embodiment of arc fault detector 20 above.

Figure 7:
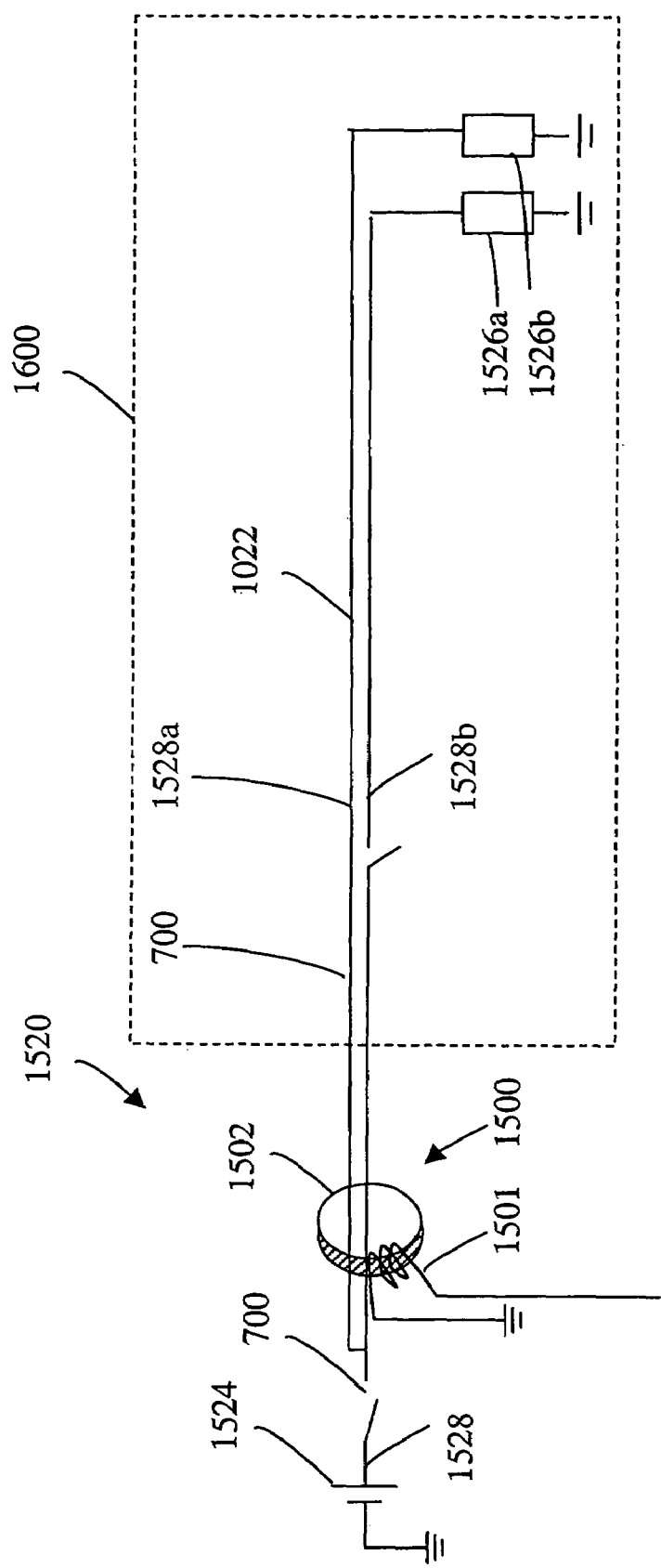
FIG. 7 is a simplified fragmentary view illustrating an aspect of the present invention.

FIG. 7 is a fragmentary simplified diagram illustrating how coil 1501 wrapped around a toroidal core 1502 is used as part of an arc fault detector 1520 protecting a zone 1600.

As shown on FIG. 7, arc fault detector 1520 provides protection to a circuit 1522 and zone 1600. Circuit 1522 includes a direct current power source or battery 1524 providing power to loads 1526*a*, 1526*b* via respective conductors 1528*a*, 1528*b*. A line interrupter 700 is disposed in circuit 1522. Both conductors 1528*a*, 1528*b* pass through the center of toroidal core 1502. When a current changes due to arc fault in either conductor 1528*a*, 1528*b*, a voltage is induced in coil 1501. An arc determining circuit, signal transformer, switch transient detector, manual switch, switch controller, and line interrupter 700 may be incorporated in arc fault detector 1520 as described above.

Figure 8:
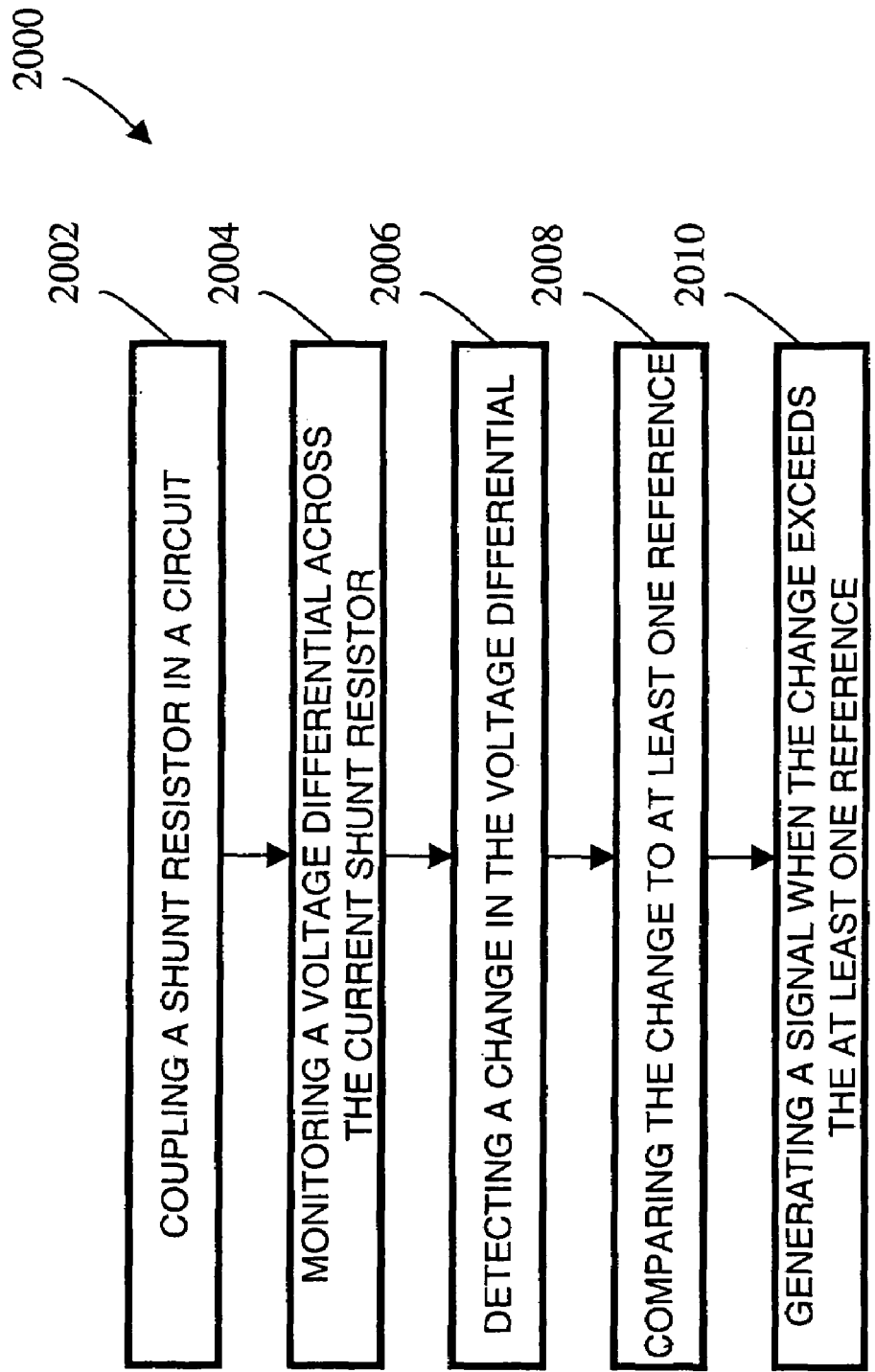
FIG. 8 is a flow diagram of an exemplary method in accordance with the present invention.

As shown on FIG. 8, a first preferred method 2000 for detecting an arc fault in a circuit in accordance with present invention includes providing a shunt resistor in the circuit 2002, monitoring a voltage differential across the shunt resistor 2004, detecting a change in the voltage differential 2006, comparing the change to at least one threshold 2008, and generating a signal when the change exceeds the at least one threshold 2010.

Figure 9:
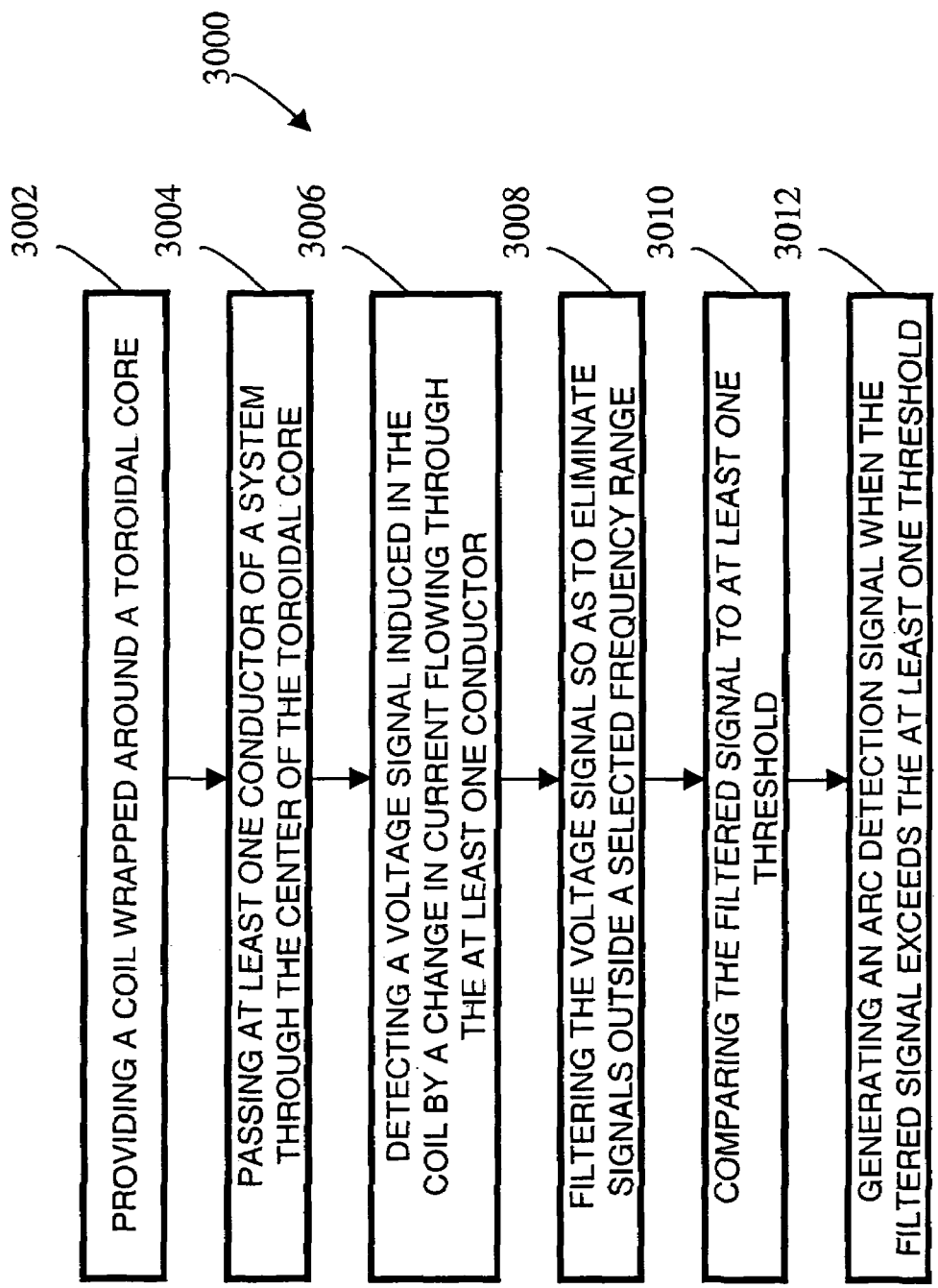
FIG. 9 is a flow diagram of another exemplary method in accordance with the present invention.

As shown on FIG. 9, a second preferred method 3000 of detecting an arc fault in a system includes providing a coil wrapped around a toroidal core 3002; passing at least one conductor of the system through the center of the toroidal core 3004; detecting a voltage induced in the coil by a change in current flowing through the at least one conductor 3006; comparing the voltage to at least one threshold 3008; and generating a signal when the voltage exceeds the at least one threshold 3010.

The preferred embodiments shown and described herein are provided merely by way of example and are not intended to limit the scope of the invention in any way. Preferred dimensions, ratios, materials and construction techniques are illustrative only and are not necessarily required to practice the invention. It is intended that the scope of the present invention herein disclosed should not be limited by the particular disclosed embodiments herein. Further modifications and alterations may occur to others upon reading and understanding the specification.

For example, in an exemplary embodiment, line interrupter 700 is preferably embodied as a static relay. Line interrupter 700 may also be an electromechanical switch, a thyristor, an intelligent switch, or the like. Schmitt Trigger 310 and J-K Flip Flop 312 may be replaced by other devices that provide pulsed signals known to those skilled in the art such as monostable multivibrators, bistable multivibrators, timers, latches, or the like.

What is claimed is:

1. An arc fault detector for a circuit comprising:
    a current monitor detecting a rate of change in electrical current in said circuit and producing a first signal indicative of said rate of change;
    a signal isolator electrically coupled in series with said current monitor, said isolator filtering said first signal to substantially eliminate signals outside a selected frequency range, said signal isolator producing a filtered signal representing changes in said electrical current within said selected frequency range;
    an arc indicator producing an arc detection signal when a level of said filtered signal exceeds at least one threshold; and
    a switch transient detector detecting an arc condition caused by an opening of a switch under load, said switch transient detector detecting a voltage differential across said switch and providing a switch transient signal when said voltage differential exceeds a reference value.

2. The arc fault detector of claim 1 wherein the voltage of said filtered signal is indicative of a magnitude of change in said electrical current in said circuit.

3. The arc fault detector as recited in claim 1 wherein said current monitor comprises a coil and a toroidal core.

4. The arc fault detector as recited in claim 1 wherein said arc indicator comprises an amplifier.

5. The arc fault detector as recited in claim 3 further comprising:
    an attenuator electrically coupled in series with said current monitor and said filter, said attenuator attenuating at least one of said first signal and said filtered signal, said attenuator comprising a resistor selected so that said voltage level of said filtered signal, when generated by operation of a motor commutator, is lower than said at least one threshold.

6. The arc fault detector as recited in claim 1 further comprising:
    a switch controller sensing said arc detection signal and switch transient signal and producing a trip signal, said switch controller being configured such that it is inhibited from producing a trip signal when it detects a switch transient signal.

7. An arc fault detector for a circuit comprising:
    a current monitor detecting a rate of change in electrical current in said circuit and producing a first signal indicative of said rate of change;
    a signal isolator electrically coupled in series with said current monitor, said isolator filtering said first signal to substantially eliminate signals outside a selected frequency range, said signal isolator producing a filtered signal representing changes in said electrical current within said selected frequency range; and
    an arc indicator producing an arc detection signal when a level of said filtered signal exceeds at least one threshold;
    wherein said current monitor comprises a coil and a toroidal core further comprising:
    an attenuator electrically coupled in series with said current monitor and said filter, said attenuator attenuating at least one of said first signal and said filtered signal, said attenuator comprising a resistor selected so that said voltage level of said filtered signal, when generated by operation of a motor commutator, is lower than said at least one threshold;
    wherein said arc indicator comprises a Schmitt Trigger.

8. The arc fault detector of claim 7 wherein the voltage of said filtered signal is indicative of a magnitude of change in said electrical current in said circuit.

9. The arc fault detector as recited in claim 7 wherein said current monitor comprises a coil and a toroidal core.

10. The arc fault detector as recited in claim 9 further comprising:
    an attenuator electrically coupled in series with said current monitor and said filter, said attenuator attenuating at least one of said first signal and said filtered signal, said attenuator comprising a resistor selected so that said voltage level of said filtered signal, when generated by operation of a motor commutator, is lower than said at least one threshold.

11. The arc fault detector as recited in claim 7 wherein said arc indicator comprises an amplifier.

* * * * *